(12) United States Patent
McAndrew et al.

(10) Patent No.: US 8,729,954 B2
(45) Date of Patent: May 20, 2014

(54) MOFSET MISMATCH CHARACTERIZATION CIRCUIT

(75) Inventors: Colin C. McAndrew, Phoenix, AZ (US); Michael J. Zunino, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/222,323

(22) Filed: Aug. 31, 2011

(65) Prior Publication Data

US 2013/0049852 A1 Feb. 28, 2013

(51) Int. Cl.
*H03K 17/687* (2006.01)

(52) U.S. Cl.
USPC ............... 327/437; 327/77; 327/78; 327/538; 327/541; 327/361

(58) Field of Classification Search
USPC ........ 438/14–18; 327/77, 78, 80, 81, 85, 143, 327/538, 541, 543, 437
See application file for complete search history.

(56) References Cited

U.S. PATENT DOCUMENTS

| | | | |
|---|---|---|---|
| 3,952,185 A | | 4/1976 | Stultz et al. |
| 4,906,871 A * | | 3/1990 | Iida ................. 326/66 |
| 4,980,580 A * | | 12/1990 | Ghoshal ............ 326/2 |
| 5,041,741 A * | | 8/1991 | Steele ............. 326/33 |
| 5,438,287 A * | | 8/1995 | Faue ................. 327/54 |
| 5,598,111 A * | | 1/1997 | Enomoto ............ 326/83 |
| 6,207,473 B1 * | | 3/2001 | Hirai et al. ............ 438/106 |
| 6,522,323 B1 * | | 2/2003 | Sasaki et al. ......... 345/204 |
| 7,002,241 B1 * | | 2/2006 | Mostafazadeh et al. ...... 257/678 |
| 7,129,566 B2 * | | 10/2006 | Uehling et al. ............ 257/620 |
| 7,282,952 B2 * | | 10/2007 | Oka ............... 326/63 |
| 7,408,372 B2 | | 8/2008 | Agarwal et al. |
| 7,711,998 B2 | | 5/2010 | Foeste |
| 7,818,137 B2 | | 10/2010 | Agarwal et al. |
| 2003/0127995 A1 * | | 7/2003 | Kramer et al. ........... 315/291 |
| 2009/0206827 A1 * | | 8/2009 | Aimuta et al. ........... 324/207.25 |
| 2009/0310430 A1 | | 12/2009 | Chuang et al. |
| 2010/0007404 A1 | | 1/2010 | Hwang |
| 2010/0123483 A1 * | | 5/2010 | Chung et al. ............ 327/63 |

OTHER PUBLICATIONS

Agarwal, K., et al., "Rapid Characterization of Threshold Voltage Fluctuation in MOS Devices", IEEE International Conference on Microelectronic Test Structures, Mar. 19-22, Tokyo, Japan, 2007, pp. 74-77.

(Continued)

*Primary Examiner* — Long Nguyen
*Assistant Examiner* — Patrick Chen
(74) *Attorney, Agent, or Firm* — Mary Jo Bertani

(57) ABSTRACT

A semiconductor device comprising a first inverter circuit including a first PMOS transistor and a first NMOS transistor, a drain electrode of the first PMOS transistor coupled to a drain electrode of the first NMOS transistor, and a second inverter circuit including a second PMOS transistor and a second NMOS transistor, a drain electrode of the second PMOS transistor coupled to a drain electrode of the second NMOS transistor. A first output voltage pad coupled to gate electrodes of the first and second PMOS and NMOS transistors, and between the drain electrode of the first PMOS transistor and the drain electrode of the NMOS transistor to self-bias the first inverter circuit. A second output voltage pad coupled between the drain electrode of the second PMOS transistor and the drain electrode of the second NMOS transistor.

23 Claims, 3 Drawing Sheets

(56) References Cited

OTHER PUBLICATIONS

Mukhopadhyay, S., et al., "Statistical Characterization and On-Chip Measurement Methods for Local Random Variability of a Process Using Sense-Amplifier-Based Test Structure", ISSCC, Session 22, Digital Circuit Innovations, 22.2, 2007, pp. 400-401.

Conti, M., et al., "A Modular Test Structure for CMOS Mismatch Characterization", IEEE ISCAS, 2003, pp. V-569-V-572.

Shimizu, Y., et al., "Test Structure for Precise Statistical Characteristics Measurement of MOSFETs", Proc. IEEE 2002 Int. Conference on Microelectronic Test Structures, vol. 15, Apr. 2002, pp. 49-54.

Terada, K., et al., "A Test Circuit for Measuring Mosfet Threshold Voltage Mismatch", IEEE ICMTS 2003, pp. 03-227 thru 03-231.

U.S. Appl. No. 13/222,335, Office Action—Rejection, mailed Jul. 25, 2013.

Office Action mailed Oct. 7, 2013 in U.S. Appl. No. 13/222,335.

U.S. Appl. No. 13/222,335, McAndrew, et al., Office Action—Rejection, mailed Mar. 18, 2014.

* cited by examiner

MOFSET MISMATCH CHARACTERIZATION CIRCUIT

CROSS-REFERENCE TO RELATED APPLICATION(S)

This application is related to U.S. patent application Ser. No. 13,222,335, filed on even date, entitled "Mosfet Mismatch Characterization Circuit," naming Colin McAndrew and Brandt Braswell as inventors, and assigned to the current assignee hereof.

BACKGROUND

1. Field

This disclosure relates generally to electronic circuits, and more specifically, to circuits for characterizing transistor mismatch.

2. Related Art

MOSFET mismatch is a leading cause of yield loss for analog circuits. Mismatch can vary over time in a manufacturing process, but characterization and on-going monitoring are difficult as they can, if the amount of mismatch is small, require precision and/or time-consuming measurements that are not available or are undesirable in a manufacturing environment.

Direct drain current mismatch measurements, including over bias and geometry, can be used for mismatch characterization via a technique known as backward propagation of variance (BPV). In other approaches, threshold voltage and gain factor mismatch can be used for characterization and/or circuit modeling purposes. Whatever data are used, the test structures for mismatch characterization must be laid out very carefully and the measurements must be done extremely accurately because for precision circuits, mismatches of the order of 0.1% are important (e.g. for a 10 bit data converter, $2^{10}=1024$ so the least significant bit needs to be accurate to order 0.1%).

Because of the need for highly symmetric device layouts and highly precise measurements, mismatch characterization is difficult and has primarily been done in a lab and not a production test environment. This means that mismatch has often not been tracked over time.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of systems and methods disclosed herein provide a circuit that generates a large, easy to measure output voltage that depends only on mismatch between metal-oxide-semiconductor field-effect transistors (MOSFET) in one inverter stage and transistors in another inverter stage. The circuit can be located in unused portions of a semiconductor wafer, or implemented in one or more integrated circuit dies on the wafer to enable cost-effective, reliable monitoring and control of transistor mismatch during fabrication to increase yield and device reliability.

Figure 1:
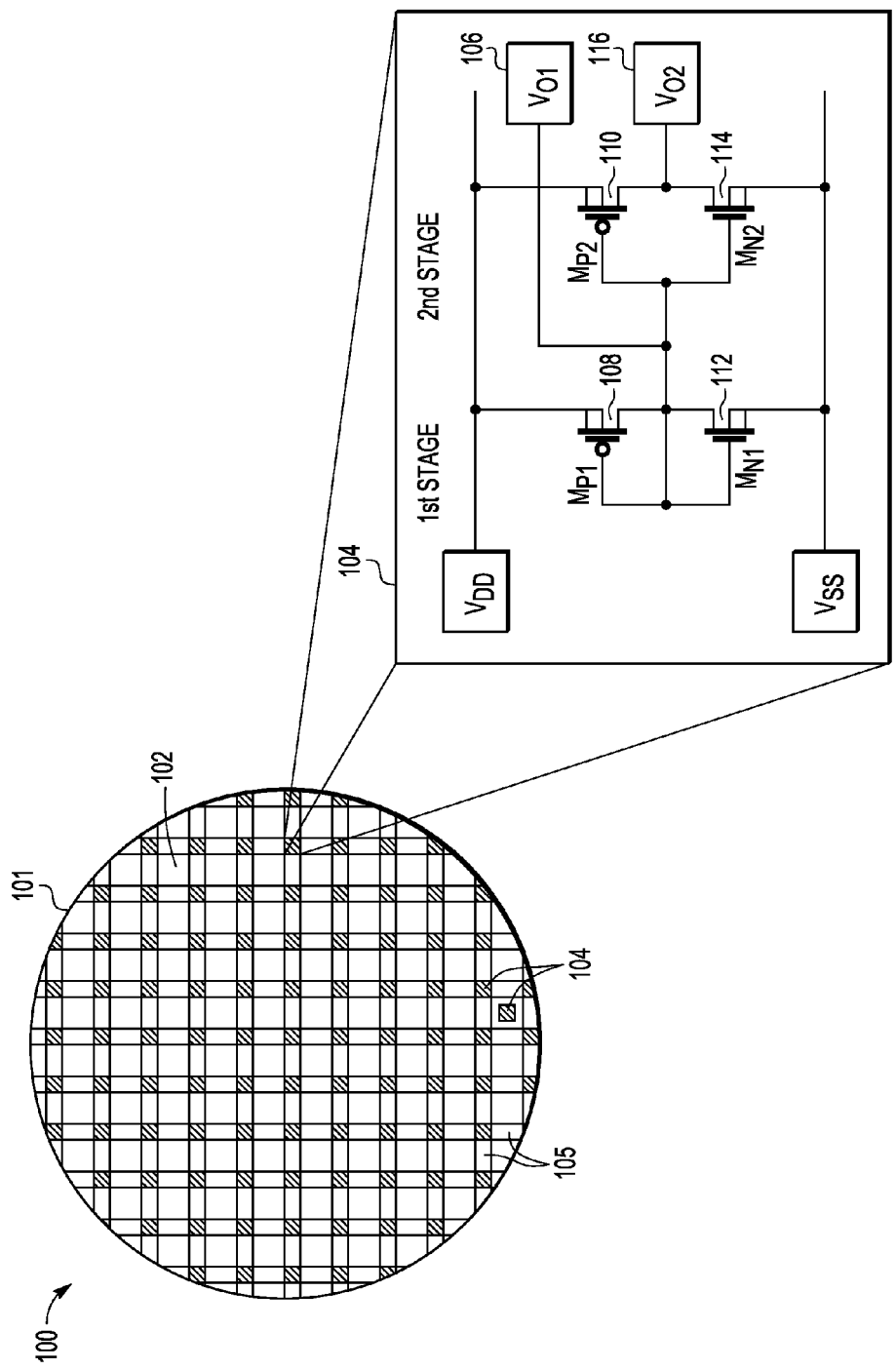
FIG. 1 is a schematic diagram of an embodiment of a semiconductor device including a circuit that can be used to indicate transistor mismatch.

Referring to FIG. 1, a semiconductor device 100 is shown that includes wafer 101 on which a plurality of semiconductor die structures 102 are formed. Transistor mismatch circuits 104 can be formed anywhere along a grid of horizontal and/or vertical scribe streets 105 between the die structures 102 even though circuits 104 are shown at the intersections of horizontal and vertical scribe streets 105. Circuits 104 can also be formed in one or more die structures 102 in addition to or instead of being formed in scribe streets 105.

Circuits 104 can include first P-type metal oxide semiconductor (PMOS) transistor 108, second PMOS transistor 110, first N-type metal oxide semiconductor NMOS transistor 112, and second NMOS transistor 114. Transistors 108, 110, 112, 114 each can have a source electrode, a drain electrode, a gate electrode, and a body electrode. The gate electrodes of first and second PMOS transistors 108, 110 and first and second NMOS transistors 112, 114 are coupled to the drain electrodes of first PMOS transistor 108 and first NMOS transistor 112. The drain electrode of second PMOS transistor 110 is coupled to the drain electrode of second NMOS transistor 114. The first output terminal Vo1 is coupled to the drain electrodes of first PMOS transistor 108 and first NMOS transistor 112. The second output terminal Vo2 is coupled to the drain electrodes of second PMOS transistor 110 and second NMOS transistor 114.

Voltage supply Vdd is coupled to the source and bulk electrodes of first and second PMOS transistors 108, 110. Voltage supply Vss is coupled to the source and bulk electrodes of first and second NMOS transistors 112, 114.

The difference between voltage at first output terminal Vo1 106 and voltage at second output terminal Vo2 116 indicates mismatch between the transistors 108, 110 112, 114. First PMOS and NMOS transistors 108, 112 form a self-biased inverter circuit. Second PMOS and NMOS transistors 110, 114 form a second stage inverter circuit that amplifies transistor mismatch of the self-biased inverter circuit.

The mismatch measurements can be used to characterize transistors on wafer 101 right after wafer 101 is manufactured. Since it is desirable for similar types of transistors on semiconductor device 100 to have the same or similar characteristics, corrective action can be taken in subsequent manufacturing steps to reduce the differences between the transistors on wafers 101 if the mismatch characteristics are not acceptable.

The difference between the voltages at the first and second output terminals 106, 116 is due to mismatch between first and second PMOS transistors 108, 110, and/or first and second NMOS transistors 112, 114.

The geometry of the transistors 108, 110, 112, 114 can be varied to accentuate differences between transistors 108, 110, 112, 114. For example, transistors 108, 110, 112, 114 can be formed with minimum length and width according to design rules for the process technology. In another example, the width of minimum length first and second PMOS transistors 108, 110 can be selected to have current drive capability comparable to first and second NMOS transistors 112, 114. In another example, the length and/or width for NMOS transistors 112, 114 can be formed to be greater than the minimum according to design rules for the process technology and the length for PMOS transistors 108, 110 can be the same as for NMOS transistors 112, 114 while the width for PMOS transistors 108, 110 can be scaled to give current drive comparable to NMOS transistors 112, 114. Alternatively, the minimum length for NMOS transistors 112, 114 can be used in circuit 104 with widths scaled to four or nine times the minimum width, or other suitable scale factor with minimum length for PMOS transistors 108, 110 with widths scaled to have current drive capability comparable to first and second NMOS transistors 112, 114.

Figure 2:
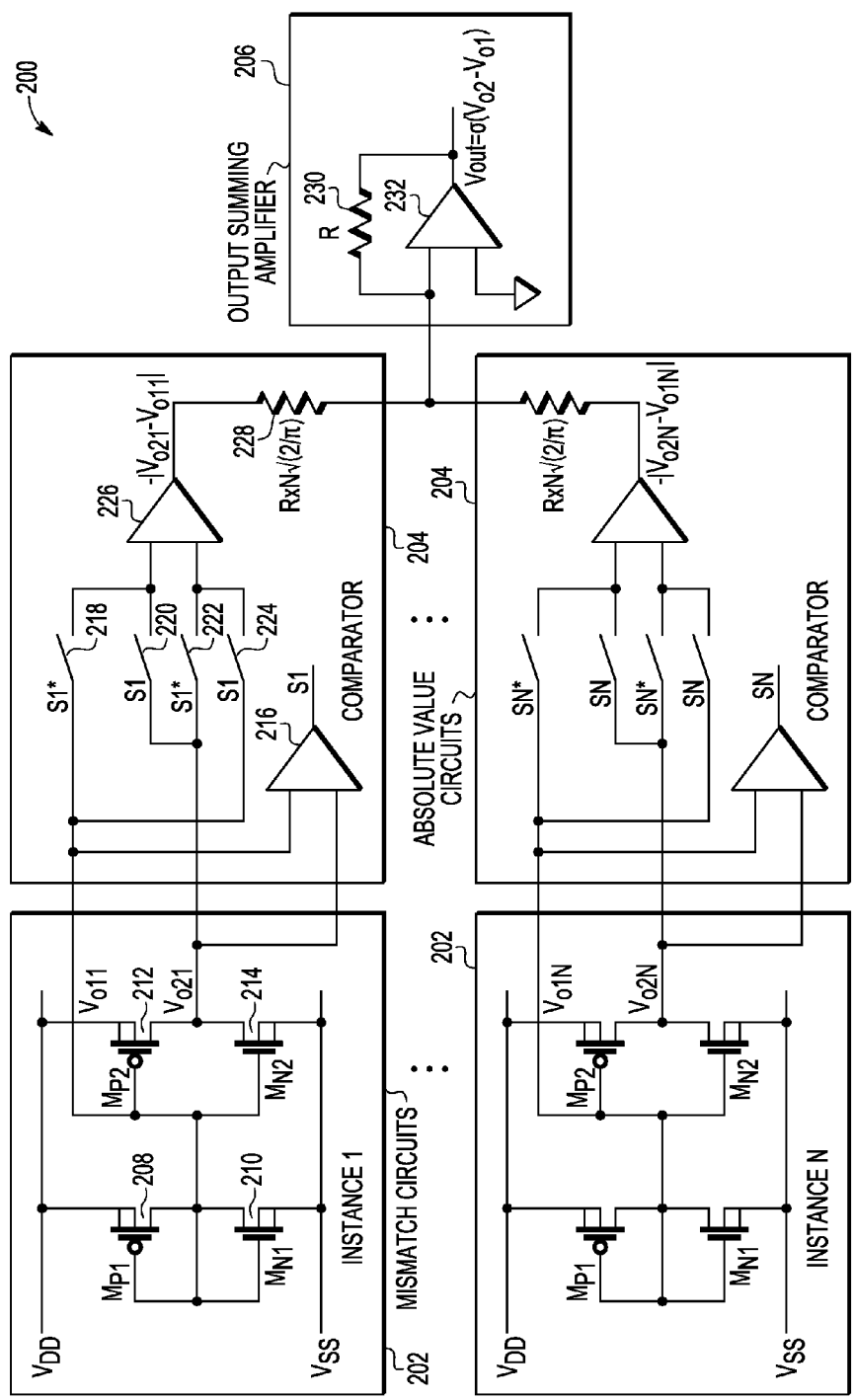
FIG. 2 is a schematic diagram of an embodiment of a circuit that can be used to characterize transistor mismatch in the semiconductor device of FIG. 1.

FIG. 2 is a schematic diagram of an embodiment of a circuit 200 that can be used to characterize transistor mismatch on semiconductor device 100 of FIG. 1 that comprises a plurality of transistor mismatch circuits 202, a plurality of absolute value circuits 204, and a characterization circuit 206 formed on semiconductor wafer 101. Characterization circuit 206 is coupled to receive input provided by a mismatch circuit 202 and absolute value circuit 204 and is configured to output a standard deviation of mismatch between transistors 208/212, 210/214 in a mismatch circuit 202. Transistor mismatch circuit 202 outputs values Vo1 and Vo2 and the difference between these output voltages is indicative of mismatch between PMOS transistors 208/212 and between NMOS transistors 212, 214. Absolute value circuit 204 and characterization circuit 206 receive the output of a mismatch circuit 202 and provides a value indicating the standard deviation of the mismatch between the transistors 208/212, 210/214.

Characterization circuit 206 can be implemented as a summing amplifier that includes operational amplifier 232 coupled in parallel to resistor 230. Resistors 228 are coupled in series between respective transistor mismatch circuits 202 and absolute value circuits 204 and the summing amplifier. Resistor 230 has a value of R ohms and resistors 228 have a value equal to the value of the first resistor times the number of transistor mismatch circuits times the square root of 2 divided by pi ($2/\pi$) to determine the standard deviation of mismatch between transistors 208/212, 210/214 in the mismatch circuits 202. Note that other types of characterization circuits 206 can be implemented on semiconductor device 100 instead of or in addition to a summing amplifier to provide indicators or measurements of characteristics of transistor mismatch other than standard deviation.

Transistor mismatch circuits 202 are similar to transistor mismatch circuits 104 of FIG. 1 and include a first stage inverter circuit with PMOS transistor 208 and NMOS transistor 210. A drain electrode of PMOS transistor 208 is coupled to a drain electrode of NMOS transistor 210. A second stage inverter circuit forming a second stage of mismatch circuit 202 includes PMOS transistor 212 and NMOS transistor 214. A drain electrode of PMOS transistor 212 is coupled to a drain electrode of NMOS transistor 214. A first output voltage Vo1 is coupled between the drain electrodes of first PMOS transistor 208 and first NMOS transistor 210 and to the gate electrodes of PMOS transistors 208, 212 and NMOS transistors 210, 214. A second output voltage V02 is coupled between the drain electrodes of second PMOS transistor 212 and second NMOS transistor 214. Source and bulk electrodes of PMOS transistors 208, 212 are coupled to Vdd, and source and bulk electrodes of NMOS transistors 210, 214 are coupled to Vss.

A plurality of absolute value circuits 204 can be coupled between respective transistor mismatch circuits 202 and the characterization circuit 206. In some embodiments, absolute value circuits 204 can include comparator 216 that has a first input coupled to the first output voltage Vo1 of transistor mismatch circuits 202. A second input of each comparator 216 is coupled to a respective second output voltage V02 from the transistor mismatch circuit 202. Comparator 216 provides an output (denoted as s1 . . . sN for respective N-number of comparators) that is used to select inputs to respective unity gain buffer 226.

Unity gain buffers 226 are configured to receive first and second inputs, and to provide an output that indicates the absolute value of the difference between the output voltages Vo1 and Vo2 of the respective transistor mismatch circuit 202. The first input of unity gain buffer 226 is coupled to a first set of switches 218, 220 that operate based on the output of comparator 216. Switch 218 closes and switch 220 opens to provide a first output voltage Vo1 to a first input of unity gain buffer 226 when a first output voltage is less than a second output voltage. Switch 218 opens and switch 220 closes to provide a second output voltage V02 to the first input of unity gain buffer 226 when a second output voltage is less than a first output voltage.

The second input of unity gain buffer 226 is coupled to a second set of switches 222, 224 that operate based on the output of comparator 216. Switch 222 closes and switch 224 opens to provide a second output voltage V02 to the second input of the third comparator when a first output voltage is less than a second output voltage. Switch 222 opens and switch 224 closes to provide a first output voltage Vo1 to the second input of unity gain buffer 226 when a first output voltage is greater than a second output voltage.

Figure 3:
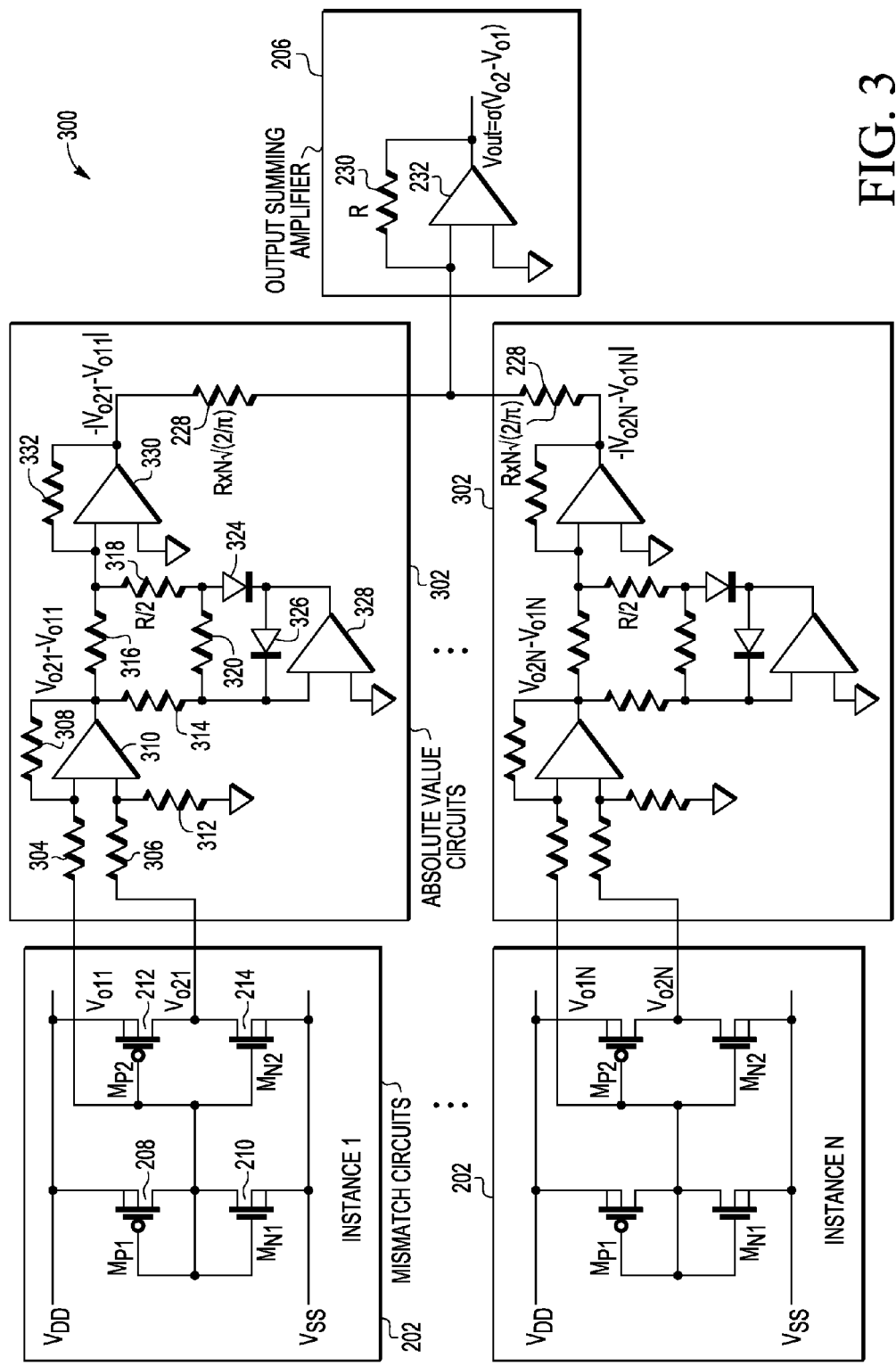
FIG. 3 is a schematic diagram of another embodiment of a circuit that can be used to characterize transistor mismatch in the semiconductor device of FIG. 1.

FIG. 3 is a schematic diagram of another embodiment of a circuit 300 that can be used to characterize transistor mismatch that includes one or more transistor mismatch circuits 202, one or more absolute value circuits 302, and characterization circuit 206 formed on semiconductor wafer 101.

In the embodiment shown, absolute value circuits 302 are coupled between respective transistor mismatch circuits 202 and characterization circuit 206. Absolute value circuits 302 include resistor 304 coupled between a first output voltage Vo1 and a first input of operational amplifier 310. Resistor 306 is coupled between a second output voltage V02 and a second input of operational amplifier 310. Resistor 308 is coupled between the first input of operational amplifier 310 and an output of operational amplifier 310. Resistor 312 is coupled between the second input of operational amplifier 310 and ground. Resistor 314 is coupled between the output of operational amplifier 310 and a first input of operational amplifier 328. Resistor 316 is coupled between the output of operational amplifier 310 and a first input of operational amplifier 330. Resistor 318 is coupled between the first input of operational amplifier 330 and a diode 324 and one terminal of a resistor 320. The other terminal of resistor 320 is coupled to the first input of operational amplifier 328. Diode 324 is coupled between one terminal of resistor 318 and the output of operational amplifier 328. Diode 326 is coupled between the output of operational amplifier 328 and the first input of operational amplifier 328. A second input of operational amplifier 328 is coupled to ground. Resistor 332 coupled between the first input of operational amplifier 330 and the output of operational amplifier 330. A second input of operational amplifier 330 is coupled to ground. Characterization circuit 206 is summing amplifier that includes operational amplifier 232 coupled in parallel to resistor 230. The first input of operational amplifier 232 receives output of absolute value circuits 302, connected via resistors 228. The second input of operational amplifier 232 is coupled to ground.

Characterization circuit 206 is configured to output a standard deviation of mismatch between transistors 208/212, 210/214 in the mismatch circuits 202. The transistor mismatch circuits 202 outputs values Vo1 and Vo2 and the difference between these output voltages is indicative of mismatch between PMOS transistors 208/212 and between NMOS transistors 212, 214. Characterization circuit 206 receives the output of mismatch circuits 202 through absolute value circuits 302 and provides a value indicating the standard deviation of the mismatch between the transistors 208/212, 210/214.

Characterization circuit 206 can be implemented as a summing amplifier that includes operational amplifier 232 coupled in parallel to resistor 230. Resistors 228 are coupled in series between respective absolute value circuits 302 and the summing amplifier. Resistor 230 has a value of R ohms and resistors 228 have a value equal to the value of the first resistor times the number of transistor mismatch circuits times the square root of 2 divided by pi ($2/\pi$) to determine the standard deviation of mismatch between transistors 208/212, 210/214 in the mismatch circuits 202. Note that other types of characterization circuits 206 can be implemented on semiconductor device 100 instead of or in addition to a summing amplifier to provide indicators or measurements of characteristics of transistor mismatch other than standard deviation.

Transistor mismatch circuits 202 are similar to transistor mismatch circuits 104 of FIG. 1 and include a first stage inverter circuit with PMOS transistor 208 and NMOS transistor 210. A drain electrode of PMOS transistor 208 is coupled to a drain electrode of NMOS transistor 210. A second stage inverter circuit forming a second stage of mismatch circuit 202 includes PMOS transistor 212 and NMOS transistor 214. A drain electrode of PMOS transistor 212 is coupled to a drain electrode of NMOS transistor 214. A first output voltage Vo1 is coupled between the drain electrodes of first PMOS transistor 208 and first NMOS transistor 210 and to the gate electrodes of PMOS transistors 208, 212 and NMOS transistors 210, 214. A second output voltage V02 is coupled between the drain electrode of second PMOS transistor 212 and the drain electrode of the second NMOS transistor 214. Source and bulk electrodes of PMOS transistors 208, 212 are coupled to Vdd, and source and bulk electrodes of NMOS transistors 210, 214 are coupled to Vss.

One or more circuits 200, 300 can be formed with one or more transistor mismatch circuits 104, 202, absolute value circuits 204, 302 and summing amplifier or other characterization circuit 206 in various locations in scribe streets 105 and/or in IC die 102 on semiconductor wafer 101 (FIG. 1).

Once wafer 101 is processed, supply voltages Vdd and Vss can be applied to the plurality of transistor mismatch circuits 104, 202 simultaneously during probe testing. Output of the characterization circuit 206 can be measured with another probe while the supply voltages are applied to the transistor mismatch circuits 104, 202.

Because the apparatus implementing the present disclosure is, apart from transistor mismatch circuits 104, 202, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Although the disclosure has been described with respect to specific conductivity types or polarity of potentials, skilled artisans appreciate that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. For example, the circuits described herein can be implemented using any type of MOS transistor, such as standard bulk transistors, silicon on insulator transistors (with or without a body contact), and multi-gate FinFET structures, to name a few. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device comprising:
   a first P-type metal oxide semiconductor (PMOS) transistor having a source electrode, a drain electrode, and a gate electrode;
   a second PMOS transistor having a source electrode, a drain electrode, and a gate electrode;
   a first N-type metal oxide semiconductor (NMOS) transistor having a source electrode, a drain electrode, and a gate electrode; and
   a second NMOS transistor having a source electrode, a drain electrode, and a gate electrode, wherein
      the drain electrodes of the first PMOS and NMOS transistors are coupled together to a first output terminal, wherein a signal at the first output terminal depends only on an output of the first PMOS and NMOS transistors,
      the first output terminal is connected as an only input to the gate electrodes of the first and second PMOS transistors and the first and second NMOS transistors, the drain electrode of the second PMOS transistor is
coupled to the drain electrode of the second NMOS
transistor at a second output terminal,
an absolute value circuit including
a first comparator configured to generate a switch signal, and
a second comparator configured to receive the first output at a first input and the second output at a second input when the switch signal is a first value, and to receive the second output at the first input and the first output at the second input when the switch signal is a second value; and
a summing amplifier having an input coupled to the output of the second comparator, wherein the summing amplifier output a signal that indicates mismatch between the transistors.

2. The semiconductor device of claim 1 further comprising:
the first output terminal coupled between the drain and gate electrodes of the first PMOS transistor and the first NMOS transistor,
the second output terminal coupled between the drain electrodes of the second PMOS transistor and the second NMOS transistor.

3. The semiconductor device of claim 1 further comprising:
a first voltage supply coupled to the source electrodes of the first and second PMOS transistors.

4. The semiconductor device of claim 1 further comprising:
a second voltage supply coupled to the source electrodes of the first and second NMOS transistors.

5. The semiconductor device of claim 1 further comprising:
the first PMOS and NMOS transistors form a self-biased inverter circuit.

6. The semiconductor device of claim 5 wherein:
the second PMOS and NMOS transistors are included in a second circuit stage to amplify transistor mismatch of the self-biased inverter circuit.

7. The semiconductor device of claim 1 further comprising:
the difference between the voltages at the first and second output terminals is based on mismatch between at least one of: the first and second PMOS transistors, and the first and second NMOS transistors.

8. The semiconductor device of claim 1 further comprising:
the first and second PMOS transistors and the first and second NMOS transistors form a first mismatch circuit;
a second mismatch circuit including:
a first output terminal,
first and second PMOS transistors,
first and second NMOS transistors, and
a second output terminal;
a first absolute value circuit configured to output the difference between the voltage at the first and second output terminals of the first mismatch circuit;
a second absolute value circuit configured to output a difference between voltage at the first and second output terminals of the second mismatch circuit;
a summing amplifier circuit including an input coupled to the outputs of the first and second absolute value circuits, the summing amplifier is configured to generate a standard deviation of the mismatch between the transistors in the first and second mismatch circuits.

9. The semiconductor device of claim 1 further comprising:
a summing amplifier including a first input coupled to an output of the second comparator, a second input coupled to ground, and a resistor coupled between an output of the summing amplifier and the first input of the summing amplifier, wherein the output of the summing amplifier indicates mismatch between the transistors.

10. The semiconductor device of claim 1 wherein:
geometry of the transistors is minimum length NMOS transistors with width scaled four to nine times minimum length, and
minimum length for the PMOS transistors with width for the PMOS transistors scaled to give current drive comparable to the NMOS transistors.

11. A method comprising:
configuring a test circuit that measures mismatch between transistors in a semiconductor device by taking the difference between voltage at a first output terminal and voltage at a second output terminal, the configuring including:
forming the first output terminal as an only input to gate electrodes of first and second PMOS transistors and first and second NMOS transistors;
forming drain electrodes of the first PMOS transistor and first NMOS transistor coupled to the first output terminal, wherein a signal at the first output terminal depends only on an output of the first PMOS and NMOS transistors;
forming drain electrodes of the second PMOS transistor and second NMOS transistor coupled to the second output terminal;
coupling the first and second output terminals to an absolute value circuit, the absolute value circuit including
a first comparator for generating a switch signal, and
a second comparator for receiving the first output at a first input and the second output at a second input when the switch signal is a first value, and for receiving the second output at the first input and the first output at the second input when the switch signal is a second value; and
coupling an input of a summing amplifier to the output of the second comparator.

12. The method of claim 11 further comprising:
amplifying the transistor mismatch with the second PMOS and NMOS transistors.

13. The method of claim 11, wherein the first PMOS and NMOS transistors form a first inverter circuit, the method further comprising:
coupling output from the first inverter circuit to an input of the first inverter circuit to self-bias the first inverter circuit.

14. The method of claim 11 further comprising:
forming the second output terminal coupled between the drain electrode of the second PMOS transistor and the drain electrode of the second NMOS transistor.

15. The method of claim 11 further comprising:
coupling a first voltage supply to the source electrode of the first PMOS transistor and source electrode of the second PMOS transistor.

16. The method of claim 11 further comprising:
coupling a second voltage supply to the source electrodes of the first NMOS transistor and the second NMOS transistor.

17. A semiconductor device comprising:
a plurality of mismatch circuits, each of the mismatch circuits including:
- a first inverter circuit including a first PMOS transistor and a first NMOS transistor, a drain electrode of the first PMOS transistor coupled to a drain electrode of the first NMOS transistor;
- a second inverter circuit including a second PMOS transistor and a second NMOS transistor, a drain electrode of the second PMOS transistor coupled to a drain electrode of the second NMOS transistor;
- a first output voltage pad is coupled to provide an only input to gate electrodes of the first and second PMOS and NMOS transistors
- the first voltage output pad is coupled between the drain electrode of the first PMOS transistor and the drain electrode of the first NMOS transistor, wherein a signal at the first output terminal depends only on an output of the first PMOS and NMOS transistors;
- a second output voltage pad coupled between the drain electrode of the second PMOS transistor and the drain electrode of the second NMOS transistor;

a plurality of absolute value circuits, each absolute value circuit corresponding to one of the plurality of mismatch circuits and having a first input connected to the first output voltage output pad, and a second input and a third input connected to the second output voltage output pad, wherein
- a difference between voltage at the first input and the second input of the absolute value circuit is used to set a switch signal,
- a complement of the first switch signal is coupled to operate a first switch connected between the first input of the absolute value circuit and a first input of a comparator,
- the switch signal is used to operate a second switch connected between the second input of the absolute value circuit and the first input of the comparator,
- the complement of the switch signal is used to operate a third switch connected between the second input of the absolute value circuit and a second input of the comparator,
- first switch signal is used to operate a fourth switch connected between the first input of the absolute value circuit and the second input of the comparator, and an output of the first comparator is coupled as an input to a summing amplifier and an output of the summing amplifier indicates mismatch between the transistors.

18. The semiconductor device of claim 17 further comprising:
source electrodes of the first and second PMOS transistors are coupled to Vdd, and
source electrodes of the first and second NMOS transistors are coupled to Vss.

19. The semiconductor device of claim 17 wherein:
geometry of the transistors is at least one of the group consisting of:
- minimum length and width for the transistors;
- greater than minimum length and width for the transistors;
- minimum length and width for the NMOS transistors, minimum length for the PMOS transistors and width for the PMOS transistors scaled to give current drive comparable to the NMOS transistors; and
- minimum length NMOS transistors with width scaled four and nine times minimum length, minimum length for the PMOS transistors and width for the PMOS transistors scaled to give current drive comparable to the NMOS transistors.

20. The semiconductor device of claim 17 wherein:
a difference between the voltages at the first and second output pads is based on mismatch between at least one of: the first and second PMOS transistors, and the first and second NMOS transistors.

21. The semiconductor device of claim 17 wherein a difference between voltage at the first output voltage pad and the second output voltage pad indicates transistor mismatch between the transistors on the semiconductor device.

22. The semiconductor device of claim 17 further comprising:
a wafer including a plurality of semiconductor die structures and horizontal and vertical scribe streets between the die structures, wherein the first and second inverter circuits are located in one of the scribe streets.

23. The semiconductor device of claim 17 further comprising:
a wafer including a plurality of semiconductor die structures, wherein the first and second inverter circuits are located in at least one of the die structures.

* * * * *